United States Patent [19]

Takashima

[11] Patent Number: 5,726,564
[45] Date of Patent: Mar. 10, 1998

[54] TEMPERATURE-COMPENSATING METHOD FOR A RESISTANCE BRIDGE CIRCUIT, RESISTANCE BRIDGE CIRCUIT WITH TEMPERATURE-COMPENSATING CIRCUIT, AND ACCELERATION SENSOR USING THE SAME

[75] Inventor: Yoshiaki Takashima, Higashi-Matsuyama, Japan

[73] Assignee: Zexel Corporation, Tokyo, Japan

[21] Appl. No.: 431,958

[22] Filed: May 1, 1995

[30] Foreign Application Priority Data

Oct. 27, 1994 [JP] Japan ................... 6-286176

[51] Int. Cl.$^6$ ................................................. H03H 1/00
[52] U.S. Cl. ................................ 323/367; 323/907
[58] Field of Search ......................... 323/367, 907; 364/371

[56] References Cited

U.S. PATENT DOCUMENTS 4,192,005  3/1980  Kurtz ........................ 364/571
4,490,803  12/1984 Briggs ....................... 364/571
4,532,468  7/1985  Nishida et al. ............. 323/367
4,611,163  9/1986  Madeley ..................... 323/367
5,471,086  11/1995 Ipposhi et al. .............. 257/417

Primary Examiner—Peter S. Wong
Assistant Examiner—Rajnikant B. Patel
Attorney, Agent, or Firm—Wenderoth, Lind & Ponack

[57] ABSTRACT

A temperature-compensating method of a resistance bridge circuit constructed of a plurality of resistance devices, comprises: a first step of adjusting in direction and in curvature a temperature characteristic curve of an output signal issued from the resistance bridge circuit in which a resistor for temperature compensation is connected in parallel with one of a pair of the resistance devices, the pair being disposed in adjacent arms of the resistance bridge circuit; and a second step of applying an additional signal to the output signal of the resistance bridge circuit so as to offset the temperature variation of the output signal of the resistance bridge circuit.

3 Claims, 6 Drawing Sheets

TEMPERATURE-COMPENSATING METHOD FOR A RESISTANCE BRIDGE CIRCUIT, RESISTANCE BRIDGE CIRCUIT WITH TEMPERATURE-COMPENSATING CIRCUIT, AND ACCELERATION SENSOR USING THE SAME

BACKGROUND OF THE INVENTION

1. Field of the Invention

The present invention relates to a temperature-compensating method for resistance bridge circuits, and more particularly to improvements in temperature compensation of a resistance bridge circuit constructed of a plurality of piezo-resistance devices.

2. Description of the Related Art

In the art of this type, for example, in the field of resistance bridge circuits constructed of a plurality of piezo-resistance devices, it is publicly known to connect in parallel a general-type resistor such as a metal film resistor, but not a piezo-resistance device, and which has a very small temperature coefficient) with one of a pair of the piezo-resistance devices (which are disposed in adjacent arms of the bridge circuit) depending on their temperature characteristics, so that some temperature compensation of the bridge circuit can be carried out by having the piezo-resistance devices of the bridge circuit balanced in variations of their resistance values, which variations depend on variations in the environmental temperature of the piezo-resistance devices (as disclosed in Japanese Patent Laid-Open No. Sho 57-184977).

However, even in the conventional method of temperature compensation in the bridge circuit constructed of the piezo-resistance devices, it is difficult to completely remove temperature drifts (i.e., variations in the resistance values of the piezo-resistance devices caused by variations in the environmental temperature). In other words, to a certain extent, such temperature drifts remain in the bridge circuit. Consequently, in the case where additional signal processing is required due to low sensitivities of the piezo-resistance devices after a signal issued from the bridge circuit is amplified through an amplifier having a large amplification factor, since the above-mentioned remaining parts of the temperature drifts are also amplified through such amplifier, even when such remaining parts of the temperature drifts are small in amount, the temperature drifts become non-negligible amounts in the output side of the amplifier, which adversely affects the additional signal processing required in a later-stage circuit.

The reason why the temperature drifts remain in the bridge circuit even when the resistor for temperature compensation is connected in parallel with a desired one of the piezo-resistance devices of the bridge circuit is as follows. Namely, for example, as shown in FIG. 5, in a temperature range in which the bridge circuit is used, when a difference in output value or signal of the bridge circuit between a low-temperature area and a high-temperature area of the temperature range is large as shown in a solid-line characteristic curve of FIG. 5, it is possible to minimize such difference by connecting the resistor for temperature compensation in parallel with the piezo-resistance device of the bridge circuit, as shown in a dotted-line characteristic curve of FIG. 5 (the characteristic curves shown in FIG. 5 will be hereinafter referred to as the temperature characteristic curves of the output signals). However, in this case, the curvature (i.e., the degree of curving of the curve: hereinafter referred to as the temperature non-linearity) of such a dotted-line characteristic curve itself often becomes larger than that of the solid-line characteristic curve (which is shown in FIG. 5, representing the temperature characteristic curve of the output signal of the bridge circuit without the resistor for temperature compensation). This is considered to be the reason why the temperature drifts still remain in the bridge circuit even after the resistor for temperature compensation is employed in the bridge circuit.

In other words, in the conventional method of temperature compensation, it is difficult to minimize at the same time both the temperature drifts (i.e., the difference in output values of the bridge circuit between the low-temperature area and the high-temperature area) and the curvature (i.e., degree of curving) of the temperature characteristic curve representing a variation of an output value or signal of the bridge circuit with the environmental temperature (which variation of the output value or signal with the environmental temperature is hereinafter referred to as the temperature variation of the output signal), so that either of the temperature drifts or the curvature of the temperature characteristic curve may remain unminimized, which makes it impossible to realize a sufficient temperature compensation of the bridge circuit.

SUMMARY OF THE INVENTION

Under such circumstances, the present invention was made. Consequently, it is an object of the present invention to provide a temperature-compensating method for a resistance bridge circuit and a resistance bridge circuit provided with a temperature-compensating circuit, in which the temperature drifts and the curvature of the temperature characteristic curve of the bridge circuit may be separately minimized.

It is another object of the present invention to provide a precision temperature-compensating method of a resistance bridge circuit and a resistance bridge circuit provided with a temperature-compensating circuit having precision temperature-compensating capability.

It is another object of the present invention to provide an acceleration sensor which has a minimal variation of its output value even when its environmental temperature varies.

According to a first aspect of the present invention, the above objects of the present invention are accomplished by providing a temperature-compensating method for a resistance bridge circuit constructed of a plurality of resistance devices, comprising:

a first step of adjusting in direction and in curvature a temperature characteristic curve of an output signal issued from the resistance bridge circuit in which a resistor for temperature compensation is connected in parallel with one of a pair of the resistance devices, the pair being disposed in adjacent arms of the resistance bridge circuit; and a second step of applying an additional signal to the output signal of the resistance bridge circuit so as to offset the temperature variation of the output signal of the resistance bridge circuit.

Consequently, in the present invention: the temperature variation of an output signal issued from the resistance bridge circuit is compensated through the resistor for temperature compensation (hereinafter referred to as the temperature-compensating resistor); and, a remaining part of the temperature variation of the output signal of the resistance bridge circuit after the above temperature compensation is made is offset by an additional signal applied thereto, which additional signal has characteristics of a polarity-inverted version of the remaining part of the temperature variation of the output signal of the resistance bridge circuit so that the temperature variation of the output signal of the resistance bridge circuit is entirely removed in the present invention.

According to a second aspect of the present invention, the above objects of the present invention are accomplished by providing a resistance bridge circuit provided with a temperature-compensating circuit constructed of a plurality of resistance devices, characterized in that:

the resistance bridge circuit having a fourth one or a third one of the resistance devices connected in parallel with a resistor for temperature compensation, the fourth and the third ones being disposed in adjacent arms of the resistance bridge circuit;

the temperature-compensating circuit issues an output voltage signal corresponding to the temperature variation of a resistance value of an additional resistance device which has substantially the same characteristics as those of the resistance devices of the resistance bridge circuit;

the resistance bridge circuit is further provided with an adder circuit for summing an output voltage signal issued from the resistance bridge circuit and an output voltage signal issued from the temperature-compensating circuit, the adder circuit issuing the thus summed-up signal;

the resistor for temperature compensation is so selected as to have a temperature characteristic curve of the output voltage signal of the resistance bridge circuit be coincident in shape with that of the output voltage signal of the temperature-compensating circuit; and the temperature characteristic curve of the output voltage signal issued from the temperature-compensating circuit corresponds to a polarity-inverted version of the temperature characteristic curve of the output voltage signal issued from the resistance bridge circuit.

Consequently, in the present invention: the temperature variation of of an output voltage signal issued from the resistance bridge circuit is compensated for through the temperature-compensation resistor; and, remaining parts of the temperature variations of the output signals of the resistance bridge circuit after completion of the above temperature compensation are offset by additional signals issued from the temperature-compensating circuit, so that the temperature variations of the output voltage signals of the resistance bridge circuit are entirely removed.

According to a third aspect of the present invention, the above object of the present invention are accomplished by providing an acceleration sensor using a plurality of piezo-resistance devices to detect acceleration, comprising:

a resistance bridge circuit constructed of the piezo-resistance devices;

a resistor for temperature compensation, which has a low temperature coefficient and is connected in parallel with one of a pair of the piezo-resistance devices in the resistance bridge circuit, the pair being disposed in adjacent arms of the resistance bridge circuit;

a temperature-compensating circuit for issuing output voltage signal corresponding to temperature variation of a resistance value of a piezo-resistance device which has substantially the same characteristics as those of the piezo-resistance devices of the resistance bridge circuit;

an adder circuit for summing an output voltage signal issued from the resistance bridge circuit and an output voltage signal issued from the temperature-compensating circuit, the adder circuit issuing the thus summed-up output signal;

the resistor for temperature compensation being so selected as to have a temperature characteristic curve of the output voltage signal of the resistance bridge circuit be coincident in shape with that of the output voltage signal of the temperature-compensating circuit; and the temperature characteristic curve of the output voltage signal, which is issued from the temperature-compensating circuit, corresponding to a polarity-inverted version of the temperature characteristic curve of the output voltage signal issued from the resistance bridge circuit.

DESCRIPTION OF THE PREFERRED EMBODIMENTS

Hereinbelow, the present invention will be described in detail with reference to the accompanying drawings, in which it will be understood by those skilled in the art that many changes and modifications may be made without departing from the spirit and scope of the present invention.

Figure 1:
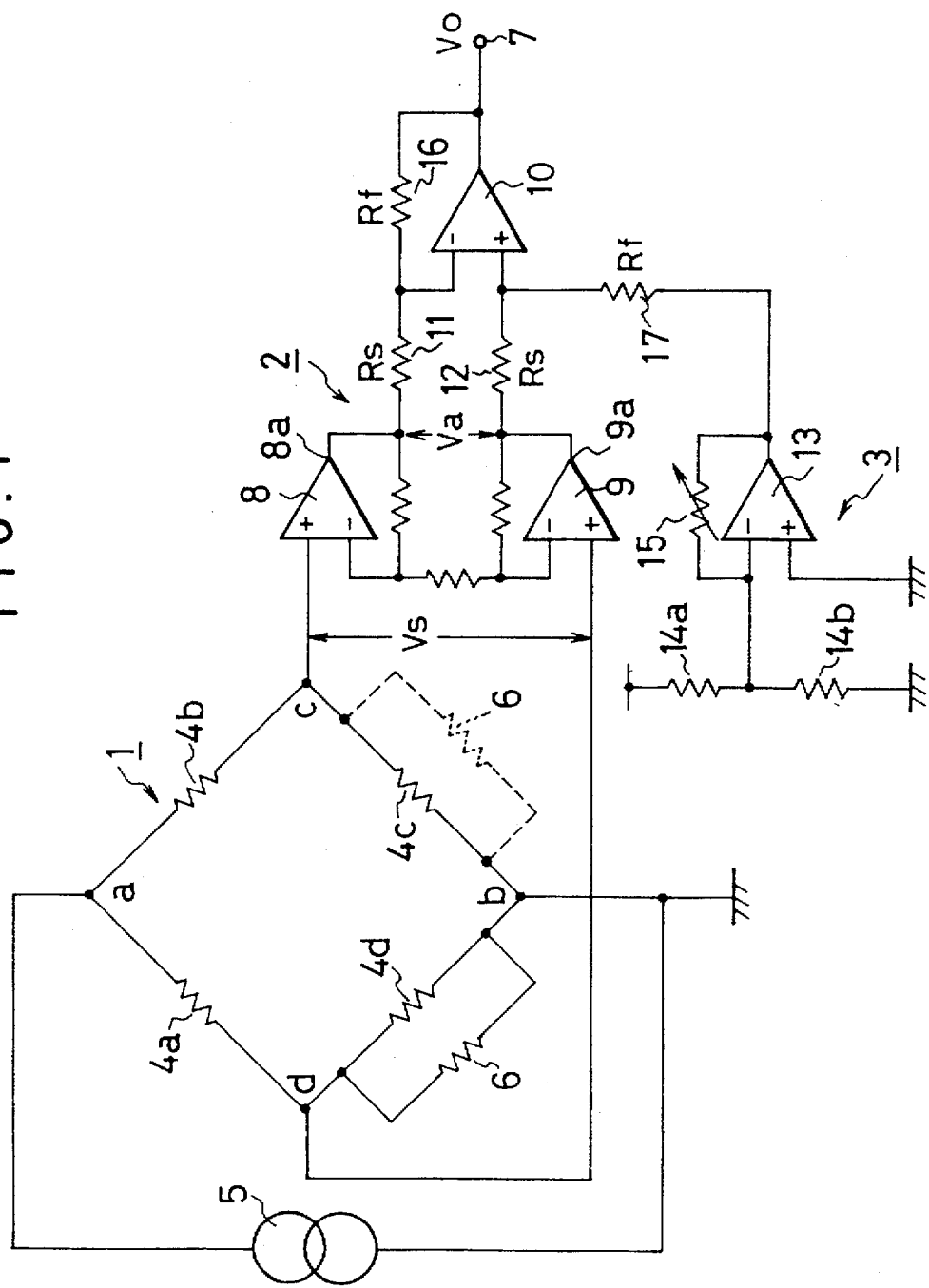
FIG. 1 is a circuit diagram of an embodiment of a resistance bridge circuit provided with a temperature-compensating circuit according to the present invention.

Referring first to FIG. 1 illustrating in construction an acceleration sensor using a plurality of piezo-resistance devices, which is an embodiment of a resistance bridge circuit provided with a temperature-compensating circuit according to the present invention, the acceleration sensor of. The present invention is substantially constructed of a detection section 1, an amplifier section 2 and a temperature-compensating circuit 3.

The detection section 1 is constructed of a bridge circuit comprising a plurality of piezo-resistance devices 4a, 4b, 4c and 4d (first, second, third and fourth piezo-resistance devices, respectively). Each of these devices is of a conventional type using a semiconductor disposed on a diaphragm (not shown). In operation, when the piezo-resistance devices 4a, 4b, 4c and 4d are subjected to pressures through their diaphragms, their resistance values vary. Consequently, when the detection section 1 has its terminals a, b connected with a constant-current power source 5, voltage variation corresponding to the degree of acceleration detected in the detection section 1 is obtained between the remaining terminals c and d of the detection section 1.

In the detection section 1, the fourth one 4d of the piezo-resistance devices 4a, 4b, 4c and 4d is connected in parallel with a resistor 6 for temperature compensation (hereinafter referred to as the temperature-compensating resistor 6), so that the bridge circuit forming the detection section 1 has its non-linear temperature in characteristics compensated for. Preferably, the temperature coefficient of the temperature-compensating resistor 6 is as small as possible.

In the amplifier section 2: differential amplification is applied to an output voltage signal having a voltage Vs issued from the detection section 1; and, an output signal issued from the temperature-compensating circuit 3 is applied to the thus differentially-amplified output voltage signal so that a final output issued from an output terminal 7 has its temperature variation minimized (described in more detail later).

The amplifier section 2 of the embodiment of the present invention is constructed of a differential-amplifier circuit comprising a plurality of operational amplifiers 8, 9 and 10. In section 2, a non-inverting input terminal (+) of the operational amplifier 8 and a non-inverting input terminal (+) of the operational amplifier 9 are connected with the terminals c and d of the detection section 1, respectively. On the other hand, an output terminal 8a of the operational amplifier 8 is connected with an inverting input terminal (−) of the operational amplifier 10 through a resistor 11 having a resistance value Rs. And, an output terminal 9a of the operational amplifier 9 is connected with a non-inverting input terminal (+) of the operational amplifier 10 through a resistor 12 having a resistance value Rs.

Further, Connected between an output terminal of the operational amplifier 10 and the inverting input terminal (−) of the same is a feedback resistor 16 having a resistance value Rf. An output terminal of the operational amplifier 10 is connected with a final output terminal 7 of the acceleration sensor of the embodiment of the present invention.

In operation, an output voltage signal issued from the temperature-compensating circuit 3 (described later) is applied to the non-inverting input terminal (+) of the operational amplifier 10, so that this output voltage signal of the temperature-compensating circuit 3 and the output voltage signal issued from the detection section 1, which has been subjected to differential amplification to become the thus differentially-amplified voltage signal, are summed up.

The temperature-compensating circuit 3 is constructed of an inverting amplifier circuit comprising the operational amplifier 13. In the temperature-compensating circuit 3, the inverting input terminal (−) of the operational amplifier 13 is connected with a junction disposed between a pair of piezo-resistance devices 14a, 14b which are connected in series with each other between a power line and the ground. Preferably, these piezo-resistance devices 14a, 14b have the same characteristics as the piezo-resistance devices 4a, 4b, 4c and 4d of the detection section 1. The piezo-resistance devices 14a, 14b are disposed in close vicinity to the detection section 1 to serve as dummy resistors for detecting the environmental temperature of the detection section 1.

Further, in the temperature-compensating circuit 3, a variable resistor 15 is disposed between the inverting input terminal (−) of the amplifier 13 and the output terminal of the same and connected therewith so as to make an output signal of the temperature-compensating circuit 3 variable in amplification degree.

Now, the resistance bridge circuit provided with the temperature-compensating circuit 3 of the embodiment of the present invention having the above construction will be described in operation so as to clarify the temperature-compensating method of the resistance bridge circuit of the present invention.

Figure 2A:
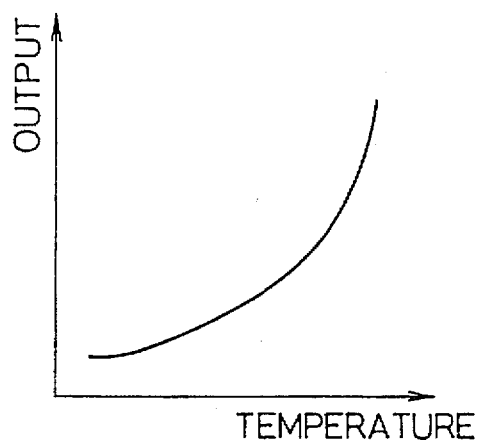
FIGS. 2(a) and 2(b) are graphs of characteristic curves schematically showing variations of output voltage signals with the environmental temperature (i.e., showing the temperature variations of a signals) in a condition in which a resistor for temperature compensation is not applied, which signals are issued from a detection section of the resistance bridge circuit.
Figure 2B:
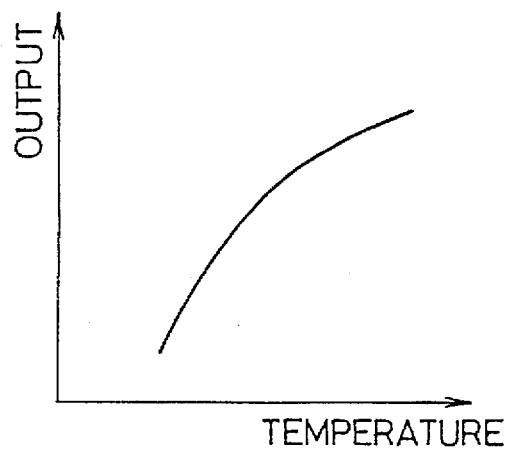

First, as for the temperature characteristic curves of the output voltage signals appearing between the terminals c and d of the detection section 1: mainly due to the presence of variations in temperature characteristics of the piezo-resistance devices 4a, 4b, 4c and 4d, these temperature characteristic curves assume: a convex shape bulging downward as shown in FIG. 2(a) or a convex shape bulging upward as shown in FIG. 2(b).

Figure 3A:
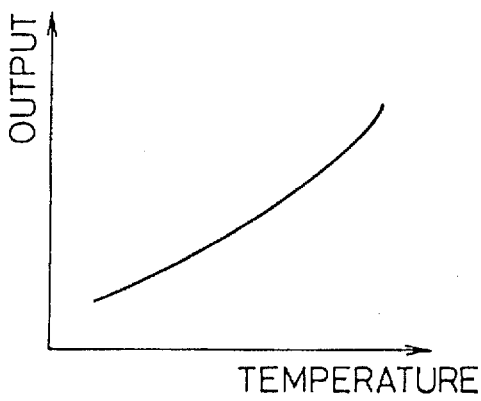
FIGS. 3(a) and 3(b) are graphs of characteristic curves schematically showing variations of output voltage signals with the environmental temperature (i.e., temperature variations of the signals) in a condition in which the resistor for temperature compensation is applied, which signals are issued from the detection section of the resistance bridge circuit.
Figure 3B:
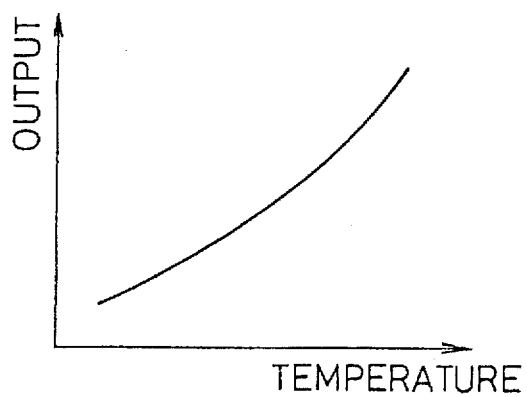

The temperature-compensating resistor 6 serves to allow the temperature characteristic curves (shown in FIGS. 2(a) and 2(b)) of the output voltage signals appearing between the terminals c and d to be reduced in curvature (i.e., degree of curving) as shown in FIG. 3(a) when the temperature characteristic curves assume the convex shape bulging downward as shown in FIG. 2(a); and, to assume the convex shape bulging downward as shown in FIG. 3(b) when the temperature characteristic curves assume the convex shape bulging upward as shown in FIG. 2(b), the temperature characteristic curves also being reduced in curvature as shown in FIG. 3(b).

Further, when the temperature characteristic curves of the output voltage signals are adjusted through the temperature-compensating resistor 6 as described above, it is necessary to have such temperature characteristic curves (which are of the output voltage signals issued from the detection section 1) be coincident in curvature with the temperature characteristic curves of the output voltage signals issued from the temperature-compensating circuit 3. In other words, in the embodiment of the present invention, it is necessary to have the temperature characteristic curve of the output voltage signal of the temperature-compensating circuit 3 (which appears in the non-inverting input terminal (+) of the operational amplifier 10 of the amplifier section 2) be coincident in curvature with the temperature characteristic curve of the voltage signal (Va) appearing between the output terminal 8a of the operational amplifier 8 and the output terminal 9a of the operational amplifier 9 in the amplifier section 2.

In the embodiment of the present invention, the temperature-compensating resistor 6 is connected in parallel with the fourth piezo-resistance device 4d. However, depending on the temperature characteristic curve of the output voltage signal appearing between the terminals c and d of the detection section 1 without the temperature-compensating resistor 6, it is often possible to realize better temperature compensation when the temperature-compensating resistor 6 is connected in parallel with the third piezo-resistance device 4c of the detection section 1. Consequently, in such case, it is natural to have the temperature-compensating resistor 6 connected in parallel with the third piezo-resistance device 4c (as shown in dotted line in FIG. 1).

The reason why the temperature-compensating resistor 6 is capable of making the above-mentioned temperature compensation is as follows.

First, resistance values of the piezo-resistance devices 4a, 4b, 4c and 4d are represented as curves of the second order as follows:

$$R1(t)=a1 \times t + b1 \times t + c1 \qquad \text{equation 1}$$

$$R2(t)=a2 \times t + b2 \times t + c2 \qquad \text{equation 2}$$

$$R3(t)=a3 \times t + b3 \times t + c3 \qquad \text{equation 3}$$

$$R4(t)=a4 \times t + b4 \times t + c4 \qquad \text{equation 4}$$

where: R1(t) denotes a resistance value of the first piezo-resistance device 4a; R2(t) a resistance value of the second piezo-resistance device 4b; R3(t) denotes a resistance value of the third piezo-resistance device 4c; and, R4(t) a resistance value of the fourth piezo-resistance device 4d. Any of a1, a2, a3 and a4, and b1, b2, b3 and b4, and c1, c2, c3 and c4 is a constant.

On the other hand, when the output voltage appearing between the terminals c and d is denoted by Vs and a constant current I is supplied to the terminals a and b, the following equation is obtained as to the resistance values of the piezo-resistance devices 4a, 4b, 4c and 4d and the output voltage V:

$$Vs=(R2 \times R4 - R1 \times R3) \times I/(R1+R2+R3+R4) \qquad \text{equation 5}$$

Substituting the equations 1 to 4 into this equation 5, the following equation 6 is obtained:

$$Vs(t)=(R2(t) \times R4(t) - R1(t) \times R3(t)) \times I \times 1/(R1(t)+R2(t)+R3(t)+R4(t))= (a \times t^2 + b \times t + c) \times I \qquad \text{equation 6}$$

Further, the constant "a" in the equation 6 may be represented by the following equation 7:

$$a=(a2 \times a4 - a1 \times a3)/(a1+a2+a3+a4) \qquad \text{equation 7}$$

where: the constants a1, a2, a3 and a4 always represent positive values due to the physical properties of the piezo-resistance devices 4a, 4b, 4c and 4d, so that a sum of the (a1+a2+a3+a4) in the equation 7 is always larger than zero.

Further, since Vs(t) is a quadratic function: when "a" is larger than zero, the function represents a convex curve bulging downward, as shown in FIG. 2(a); and, when "a" is smaller than zero, the function represents a convex curve bulging upward, as shown in FIG. 2(b). Consequently, in a condition in which the sum of the "an" (=a1+a2+a3+a4) is always larger than zero, it is possible to change the bulging direction of convex shape of the temperature characteristic curve of the output voltage signal (Vs) by changing the value of (a2×a4−a1×a3) so as to be plus or minus. In other words, connecting the temperature-compensating resistor 6 in parallel with the fourth piezo-resistance device 4d effects an adjustment of the constant a4.

In a manner as described above, the output voltage signal appearing between the terminals c and d of the detection section 1 is subjected to differential amplification through the amplifier section 2 and becomes the thus differentially-amplified output voltage signal.

On the other hand, in the temperature-compensating circuit 3, values on the temperature characteristic curve of its output voltage signal are previously adjusted or controlled through the variable resistor 15 so as to correspond to the product of a value of minus one (−1) and values on the temperature characteristic curve of the output voltage signal (Va) appearing between the output terminal 8a of the operational amplifier 8 and the output terminal 9a of the operational amplifier 9 in the amplifier section 2. Because the output terminal of this temperature-compensating circuit 3 is connected with the non-inverting input terminal (+) of the operational amplifier 10 of the amplifier section 2 through a resistor 17 having a resistance value Rs, the output voltage signal issued from the temperature-compensating circuit 3 is added to the above-mentioned voltage signal (Va).

Figure 4:
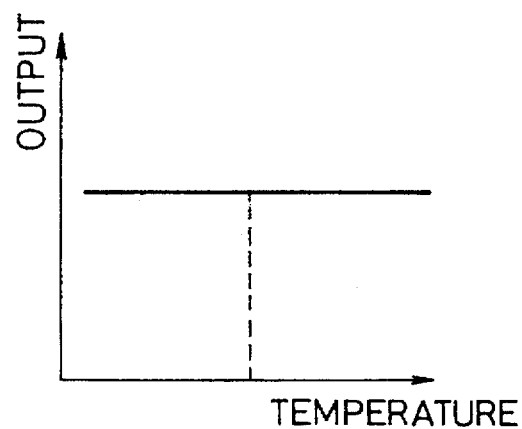
FIG. 4 is a graph of a characteristic curve schematically showing variation of a final output voltage signal with the environmental temperature (i.e., temperature variation of the final output voltage signal issued from the circuit shown in FIG. 1)
Figure 5:
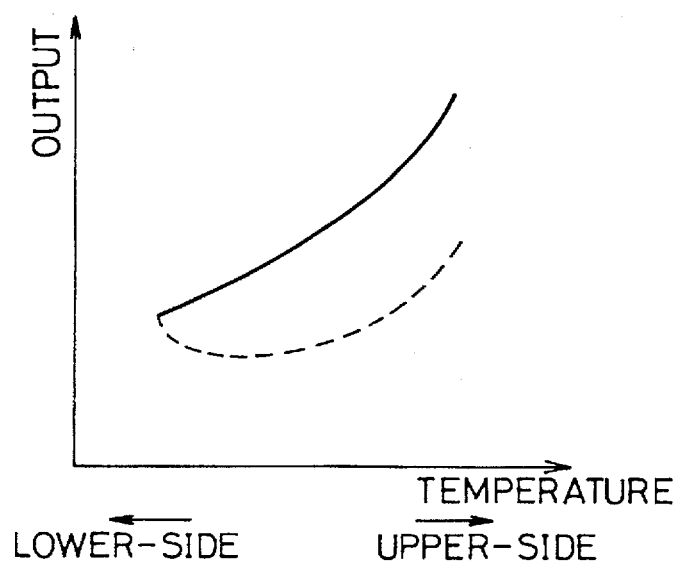
FIG. 5 is a graph of characteristic curves schematically showing the temperature variations of the output voltage signals according to the conventional temperature-compensating method.

Consequently, an output voltage signal (V0) issued from the amplifier section 2 is substantially constant in voltage regardless of temperature variation, as shown in FIG. 4.

In the embodiment of the present invention: by the use of the temperature-compensating resistor 6, the temperature characteristic curve of the differentially-amplified voltage signal (Va) corresponding to the output voltage signal issued from the detection section 1 is controlled in its bulging direction and reduced in its curvature (i.e., degree of curving) so as to be substantially coincident with the temperature characteristic curve of the output voltage signal issued from the temperature-compensating circuit 3; and, by applying the output voltage signal issued from the temperature-compensating circuit 3 having the temperature characteristic curve which is a polarity-inverted version of the temperature characteristic curve of the above-mentioned voltage signal (Va), temperature compensation of the voltage signal (Va) corresponding to the output voltage signal issued from the detection section 1 is made so as to keep the final output voltage signal of the amplifier section 2 constant regardless of temperature variation, which produces a superior precision temperature compensation to the conventional one.

Namely, in the conventional temperature compensation, only a temperature-compensating resistor is expected to serve as both the temperature-compensating resistor 6 and the temperature-compensating circuit 3 of the embodiment of the present invention. Consequently, though the conventional temperature compensation may reduce the temperature variation of the final output voltage signal (for example, such as one (V0) issued from the amplifier section 2 of the embodiment of the present invention) over the working temperature range, it is impossible for the conventional temperature compensation to realize a precision temperature compensation for keeping the temperature variation of the final output voltage signal (V0) substantially at zero over the entire working temperature range.

In contrast with this, in the embodiment of the present invention, as described above: the temperature-compensating resistor 6 controls in bulging direction and in curvature (i.e., degree of curving) the temperature characteristic curve of the output voltage signal (Va) which is issued from the detection section 1 and appears between the output terminal 8a of the operational amplifier 8 and the output terminal 9a of the operational amplifier 9 of the amplifier section 2; and, the temperature-compensating circuit 3 removes the remaining parts of the temperature variations of the final output voltage signal (V0), which effects a precision temperature compensation for keeping the final output voltage signal (V0) substantially always constant regardless of temperature variation. Such precision temperature compensation of the final output voltage signal (V0) is easily made according to the present invention.

In the embodiment of the present invention, the temperature-compensating resistor 6 is connected in parallel with the fourth one 4d or the third one 4c of the piezo-resistance devices 4a, 4b, 4c and 4d so that the temperature characteristic curve of the output voltage signal (Va) is controlled both in its bulging direction and its curvature (i.e., degree of curving). As is clear from the fact that factors for determining whether the "a" of the equation 7 is plus or minus are a3 and a4 in addition to a1 and a2, it is also possible to connect the temperature-compensating resistor 6 in parallel with any one of the first one 4a or the second one 4b of the first piezo-resistance devices 4a, 4b, 4c and 4d so as to control both in bulging direction and curvature (i.e., degree of curving) the temperature characteristic curve of the output voltage signal (Va), which effects a precision temperature compensation as the embodiment of the present invention.

Incidentally, in the embodiment of the present invention, the temperature-compensating circuit 3 is constructed of a so-called constant-voltage driven circuit, in which a temperature variation detected through the piezo-resistance devices 14a, 14b is transformed into a voltage variation. In place of this temperature-compensating circuit 3, it is also possible to use another conventional circuit, such as a temperature-compensating circuit 3A shown in FIG. 6, which is of a so-called constant-current driven type.

Figure 6:
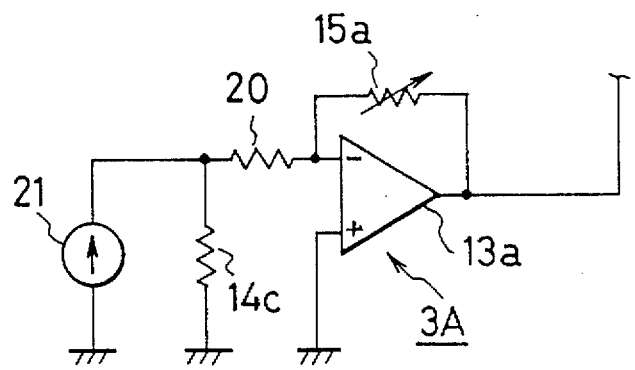
FIG. 6 is a circuit diagram of another embodiment of the temperature-compensating circuit according to the present invention.

Namely, as shown in FIG. 6, the temperature-compensating circuit 3A is constructed of an inverted-amplifier circuit comprising an operational amplifier 13a. Connected between an inverting input terminal (−) and an output terminal of the operational amplifier 13a is a variable resistor 15a. Further, the inverting input terminal (−) of the operational amplifier 13a is connected with an end of a resistor 20 which has the other end thereof grounded through a piezo-resistance device 14c.

In the temperature-compensating circuit 3A, a constant-current power source 21 is connected between the ground and a junction which is disposed between the resistor 20 and the piezo-resistance device 14c, so that a constant current is supplied to the piezo-resistance device 14c. Incidentally, the output terminal of the operational amplifier 13a is connected to an end of the resistor 17 (shown in FIG. 1).

Preferably, the piezo-resistance device 14c has the same characteristics as those of the piezo-resistance devices 4a, 4b, 4c and 4d of the detection section 1, the reason why is the same as that described in the above embodiment of the present invention shown in FIG. 1.

It is also the same reason as the above embodiment of the present invention to dispose the piezo-resistance device 14c in close vicinity of the detection section 1 so as to have the device 14c serve as a dummy resistor for detecting the environmental temperature of the detection section 1.

Incidentally, the constant-current power source 21 is constructed of a conventional circuit, and, therefore its details will be not shown here. In general, an essential component of the circuit of the power source 21, for example, is a transistor. This transistor is relatively large in its hfe (i.e., current-amplification factor), and disposes a Zener diode in its base side to keep its base current substantially constant, whereby a substantially constant emitter current is obtained.

Now, a second embodiment of the present invention will be described with reference to FIGS. 7(a) to 9(d).

In the second embodiment of the present invention, the detection section 1 of the first embodiment of the present invention shown in FIG. 1 is improved as follows, wherein the same constituent elements as those shown in FIG. 1 will be denoted by the same reference numerals and/or characters as those shown in FIG. 1. Substantially only the differences between the first embodiment and the second embodiment of the present invention will be described hereinbelow.

First, as for the embodiment shown in FIG. 1: in a condition in which the temperature characteristic curves of the output voltage signals appearing between the terminals c and d of the detection section 1 without the temperature-compensating resistor 6 assume the shapes shown in FIGS. 2(a) and 2(b) due to the presence of the temperature variations of the output signals issued from the piezo-resistance devices 4a, 4b, 4c and 4d, both the temperature-compensating resistor 6 and the temperature-compensating circuit 3 are used to make a precision temperature compensation of the final output voltage signal (V0).

However, additional findings were obtained through further studies and experiments of the temperature compensation according to the present invention. These additional findings clarify the fact that: the temperature characteristic curves of the output voltage signals appearing between the terminals c and d of the detection section 1 may assume, in addition to the shapes of the temperature characteristic curves shown in FIGS. 2(a) and 2(b), additional shapes, for example such as ones shown in FIGS. 7(a) and 7(b); and, in the one shown in FIG. 7(a), the temperature characteristic curve has a minus gradient and has a convex shape bulging upward, while in the one shown in FIG. 7(b) the temperature characteristic curve has a minus gradient and has a convex shape bulging downward.

Figure 7A:
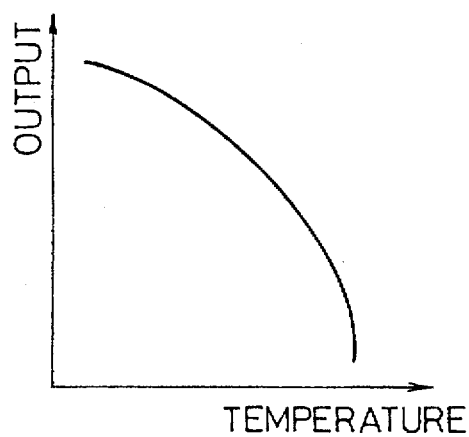
FIGS. 7(a) and 7(b) are graphs of characteristic curves schematically showing variations of the output voltage signals with the environmental temperature (i.e., temperature variations of the output voltage signals) before temperature compensation is made, the output voltage signal being issued from the detection section.
Figure 7B:
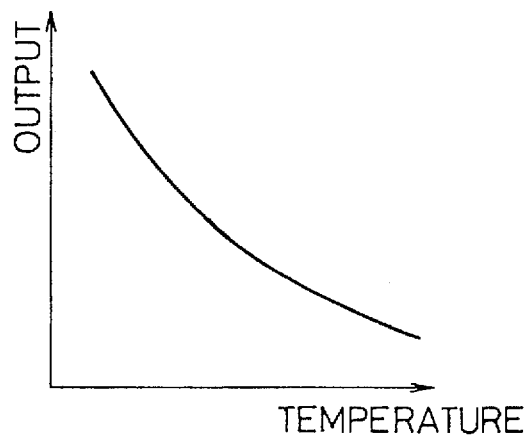

With respect to the shapes of the temperature characteristic curves shown in FIGS. 7(a) and 7(b), it is difficult for the temperature-compensating resistor 6 alone to realize the temperature characteristic curves of the first embodiment of the present invention shown in FIGS. 3(a) and 3(b).

On the other hand, since the piezo-resistance devices 14a, 14b of the temperature-compensating circuit 3 have their resistance values increased as the environmental temperature increases, the temperature characteristic curve of the output signal issued from the temperature-compensating circuit 3 has its gradient be plus only, which often makes it impossible to offset the temperature variation of the output voltage signal issued from the detection section 1.

Figure 8:
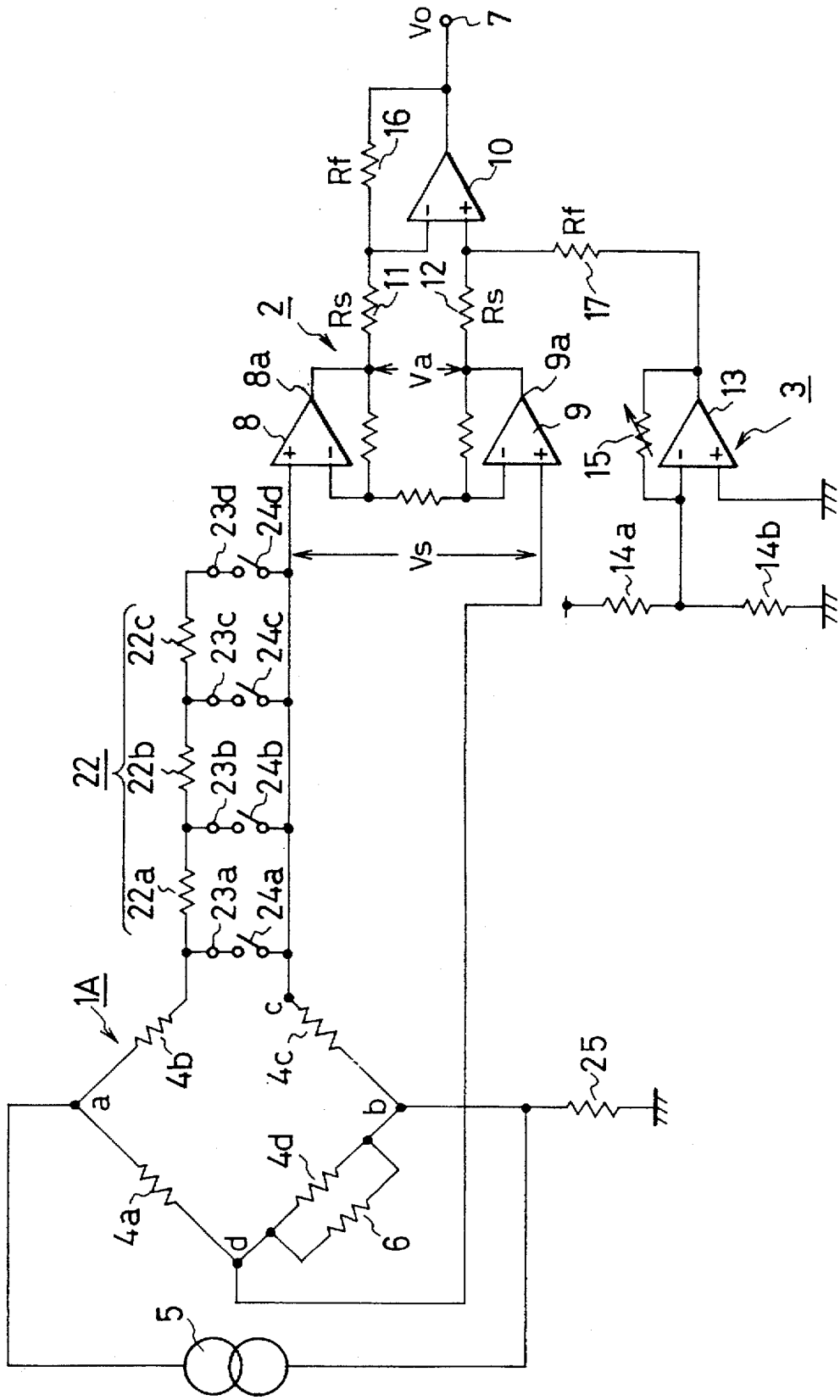
FIG. 8 is a circuit diagram of a second embodiment of the resistance bridge circuit of the present invention.

In order to solve this problem, as shown in FIG. 8, in the second embodiment of the present invention, a gradient-compensating piezo-resistance device 22 is connected between an end of the second one 4b and an end of the third one 4c of the piezo-resistance device 4a, 4b, 4c and 4d of the detection section 1A, in which: the second piezo-resistance device 4b is oppositely disposed from the fourth piezo-resistance device 4d with which the temperature-compensating resistor 6 is connected in parallel: and, the third piezo-resistance device 4c is disposed between the second one 4b and the fourth one 4d of the piezo-resistance devices 4a, 4b, 4c and 4d.

Namely, in the second embodiment of the present invention, the gradient-compensating piezo-resistance device 22 is constructed of a first dividing-resistance portion 22a, a second dividing-resistance portion 22b and a third dividing-resistance portion 22c. Each of taps 23a, 23b, 23c and 23d extends from each of the ends of the dividing-resistance portions 22a, 22b and 22c.

The taps 23a, 23b, 23c and 23d are connected with ends of selecting switches 24a, 24b, 24c and 24d, respectively. Each of the other ends of the selecting switches 24a, 24b, 24c and 24d is connected with: the other end of the third piezo-resistance device 4c; and, the non-inverting input terminal (+) of the operational amplifier 8. Incidentally, a resistor 25 is connected between the junction b of the detection section 1A and the ground.

In operation, a closure of any one of the selecting switches 24a, 24b, 24c and 24d effects a control of the degree of compensation (i.e., control of resistance values). For example, a closure of the selecting switch 24d effects an insertion of the entire resistance of the gradient-compensating piezo-resistance device 22 between the second one 4b and the third one 4c of the piezo-resistance devices 4a, 4b, 4c and 4d. On the other hand, a closure of the selecting switch 24c effects an insertion of a resistance (which corresponds to the sum of the resistance of the first dividing-resistance portion 22a and the resistance of the second dividing-resistance portion 22b) between the second one 4b and the third one 4c of the piezo-resistance devices 4a, 4b, 4c and 4d.

Further, a closure of the selecting switch 24b effects an insertion of the resistance of the first dividing-resistance portion 22a between the second one 4b and the third one 4c of the piezo-resistance devices. A closure of the selecting switch 24a effects a short circuit of the gradient-compensating piezo-resistance device 22 so that the second one 4b and the third one 4c of the piezo-resistance devices are directly connected with each other.

In the second embodiment of the present invention, each of the amplifier section 2 (without the detection section 1A) and the temperature-compensating circuit 3 is the same in construction as the corresponding one of the first embodiment of the present invention shown in FIG. 1, and, therefore will be not described here.

In the present invention having the above construction, an appropriate selection of the selecting switches 24a, 24b, 24c and 24d effects a determination as to whether the gradient of the temperature characteristic curve of the output voltage signal appearing between the junction terminals c and d is plus or minus. In practice, it is preferable to use the plus gradient in such a temperature characteristic curve.

FIGS. 9(a), 9(b) 9(c) and 9(d) schematically show graphs of the temperature characteristic curves of the output voltage signals appearing between the terminals c and d of the detection section 1A. As for the graph shown in FIG. 9(a): a closure of the selecting switch 24a effects a short circuit of the gradient-compensating piezo-resistance device 22, so that the temperature characteristic curve of the output voltage signal is minus in gradient and assumes a convex shape bulging downward.

Figure 9A:
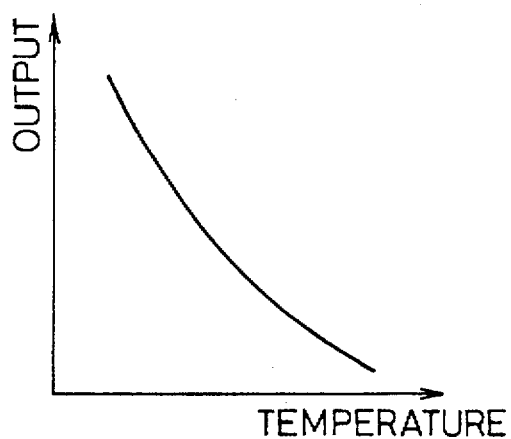
FIGS. 9(a), 9(b), 9(c) and 9(d) are graphs of characteristic curves schematically showing the temperature variations of the output voltage signals of the detection section in the second embodiment of the bridge circuit of the present invention, illustrating the effect of a piezo-resistance device compensating for the characteristic curves in gradient.
Figure 9B:
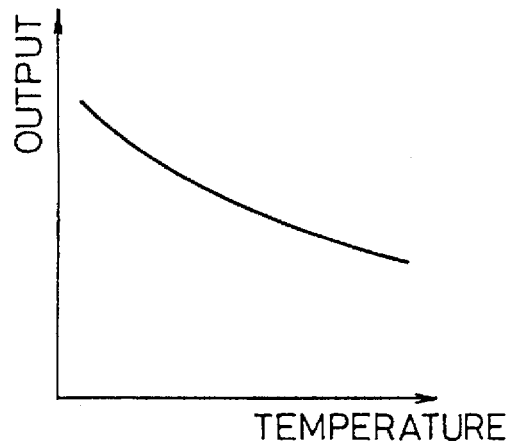
Figure 9C:
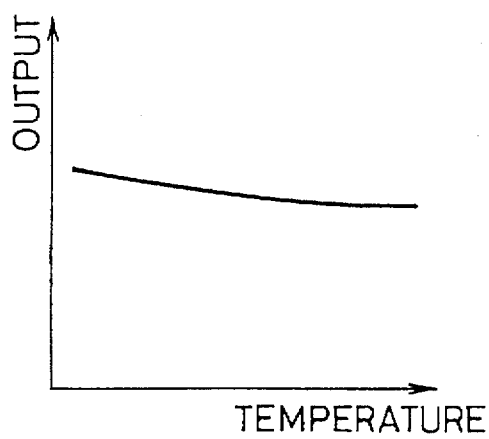
Figure 9D:
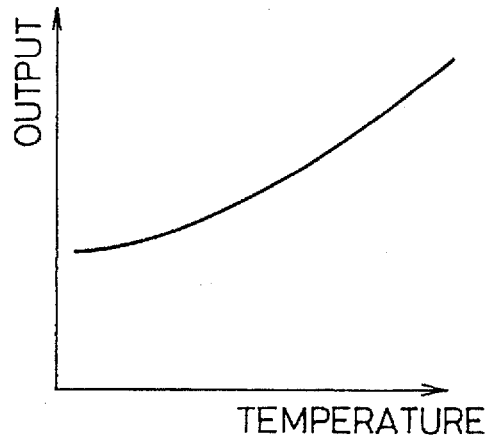

As for the graph shown in FIG. 9(b): a closure of only the selecting switch 24b effects a decrease of the gradient of the temperature characteristic curve relative to the gradient of the curve shown in FIG. 9(a). As for the graph shown in FIG. 9(c): a closure of only the selecting switch 24c effects a further decrease of the gradient of the temperature characteristic curve relative to the gradient of the curve shown in FIG. 9(b). As for the graph shown in FIG. 9(d): a closure of only the selecting switch 24d effects a change of the gradient of the temperature characteristic curve from a minus one to a plus one.

A determination as to which of the selecting switches 24a, 24b, 24c and 24d is closed depends on a setting of a resistance value of the temperature-compensating resistor 6. Namely, a control range of the gradient of the temperature characteristic curve of the output voltage signal appearing between the terminals c and d of the detection section 1A is determined by the use of the selecting switches 24a, 24b, 24c and 24d to make it easy to control the gradient of the temperature characteristic curve of the output voltage signal appearing between the terminals c and d by the use of the temperature-compensating resistor 6, whereby the temperature characteristic curve of the output voltage signal appearing between the terminals c and d is coincident in shape with the temperature characteristic curve of the output voltage signal issued from the temperature-compensating circuit 3.

Incidentally, in the second embodiment of the present invention, the gradient-compensating piezo-resistance device 22 is of a so-called tap type for effecting a stepwise control. However, it is also possible for the device 22 to be of a sliding type employed in a conventional variable resistor.

Although the temperature-compensating circuit 3 has a construction for transforming a temperature variation in resistance of the piezo-resistance devices 14a, 14b into a variation in voltage when the circuit 3 is energized with a constant-voltage power source, it is also possible to replace such constant-voltage power source with a constant-current power source described in the temperature-compensating circuit 3A shown in FIG. 6.

Further, arrangement of the temperature-compensating resistor 6 and the gradient-compensating piezo-resistance device 22 is not limited to one employed in the second embodiment of the present invention shown in FIG. 8. For example, if the temperature-compensating resistor 6 is connected in parallel with the third piezo-resistance device 4c, the gradient-compensating piezo-resistance device 22 is connected between the first one 4a and the fourth one 4d of the piezo-resistance devices, whereby a new junction (c), through which the second one 4b and the third one 4c of the piezo-resistance devices are connected with each other, serves like the terminal d of the second embodiment of the present invention show in FIG. 8.

Incidentally, the same control as that of the gradient of the temperature characteristic curve of the output voltage signal issued from the detection section 1A by the use of the gradient-compensating piezo-resistance device 22 of the second embodiment of the present invention is effected, for example, by setting any one of the piezo-resistance devices 4a, 4b, 4c and 4d forming the bridge circuit of the detection section 1A larger (or smaller) in resistance value than the remaining three. In this case, however, due to the presence of variations in resistance value of the arms of the bridge circuit, the gradient of the temperature characteristic curve becomes too large. Therefore, it is impossible for the temperature-compensating circuit 3 to offset such gradient (i.e., temperature characteristics) of the curve, which makes it impossible to accomplish the objects of the present invention.

In the second embodiment of the present invention: the provision of the gradient-compensating piezo-resistance device 22 comprising the taps 23a, 23b, 23c and 23d effects a control of the gradient of the temperature characteristic curve of the output voltage signal appearing between the terminals c and d of the detection section 1A; and, the temperature-compensating circuit 3 makes a necessary temperature compensation without failure. Consequently, it is possible to offset the temperature variation in voltage of the output signal in the terminal 7 without failure, which improves the temperature compensation of the present invention in stability to enable a user to obtain a reliable acceleration signal.

As described above, according to the present invention, a compensation of the temperature variations of the output voltage signals issued from the resistance bridge circuit is made by connecting the temperature-compensating resistor in parallel with any one of the resistance devices forming the resistance bridge circuit. After that, the remaining parts of the temperature variations are offset by applying a polarity-inverted version of the above temperature variations to such remaining parts, which makes it possible to separately effect a limitation of the temperature drift and a reduction of the curvature (i.e., degree of curving) of the temperature characteristic curve. As a result, the temperature compensation of the present invention is improved in degree of freedom, which realizes a precision temperature compensation superior to the conventional ones.

In the present invention, since the precision temperature compensation is realized, there is no fear that the temperature variation of the output signal is so amplified as to adversely affect the final output signal even when the resistance bridge circuit is low in sensitivity (and therefore the circuit requires a large-factor amplification of its output signal), which enables the user to obtain a stable output signal.

Further, the present invention provides a reliable acceleration sensor which has a sufficiently small temperature variation of its output signal.

What is claimed is:

1. A method of temperature compensation for a resistance bridge circuit which comprises a plurality of piezo-resistance devices and a resistor for temperature compensation connected in parallel with one of the plurality of resistance devices, and which has a temperature characteristic curve of an output signal issued from the resistance bridge circuit, the method comprising the steps of:

adjusting a temperature characteristic of the output signal issued from the resistance bridge circuit so as to adjust a direction and curvature of the temperature characteristic curve; and applying an additional signal to the output signal of the resistance bridge circuit to offset a temperature variation of the output signal; wherein, the additional signal applied to the output signal of the resistance bridge circuit is a voltage signal derived from a temperature variation of a resistance value of an additional resistance device which has substantially the same characteristics as the piezo-resistance devices of said resistance bridge circuit and which is disposed sufficiently close to said resistance bridge circuit so as to detect an environmental temperature of said resistance bridge circuit.

2. A circuit comprising:

a resistance bridge circuit having a plurality of piezo-resistance devices and a resistor for temperature compensation connected in parallel with one of said plurality of resistance devices;

a temperature-compensating circuit, including an additional piezo-resistance device, for issuing an output voltage signal corresponding to a temperature variation of a resistance value of said additional resistance device;

wherein said additional resistance device of said temperature compensating-circuit has substantially the same characteristics as said plurality of piezo-resistance devices of said resistance bridge circuit and is disposed sufficiently close to said resistance bridge circuit so as to detect an environmental temperature of said resistance bridge circuit;

wherein an adder circuit is coupled to said resistance bridge circuit and said temperature compensating circuit;

wherein said plurality of piezo-resistance devices comprises first, second, third and fourth piezo-resistance devices;

wherein said first piezo-resistance device being oppositely disposed from said third piezo-resistance device, said second piezo-resistance device being oppositely disposed from said fourth piezo-resistance device;

wherein said resistor for temperature compensation is connected in parallel with one of said third piezo-resistance device and said fourth piezo-resistance device; and wherein a resistor means for adjusting a gradient of the temperature characteristic curve of the output voltage signal of said resistance bridge circuit is interposed between said first piezo-resistance device and said fourth piezo-resistance device or between said second piezo-resistance device and said third piezo-resistance device;

wherein said resistor means includes a piezo-resistance device and a tap for adjusting the resistance value of said piezo-resistance device of said resistor means;

wherein said resistance bridge circuit is operable to issue an output voltage signal having a temperature characteristic curve which is coincident in shape with, and corresponds to a polarity inverted version of, a temperature characteristic curve of the output voltage signal issued from said temperature-compensating circuit; and wherein said adder circuit is operable to sum the output voltage signal issued from said resistance bridge circuit and the output voltage signal issued from said temperature-compensating circuit, and to issue a summed output voltage signal.

3. An acceleration sensor comprising:

a resistance bridge circuit having a plurality of piezo-resistance devices and a resistor for temperature compensation, which has a low temperature coefficient and is connected in parallel with one of said plurality of piezo-resistance devices;

a temperature compensating circuit including an additional piezo-resistance device, for issuing an output voltage signal corresponding to a temperature variation of a resistance value of said additional piezo-resistance device;

wherein said additional resistance device of said temperature compensating-circuit has substantially the same characteristics as said plurality of piezo-resistance devices of said resistance bridge circuit and is disposed sufficiently close to said resistance bridge circuit so as to detect an environmental temperature of said resistance bridge circuit;

wherein an adder circuit is coupled to said resistance bridge circuit and said temperature-compensating circuit;

wherein said plurality of piezo-resistance devices comprises first, second, third and fourth piezo-resistance devices;

wherein said first piezo-resistance device is oppositely disposed from said third piezo-resistance device, said second piezo-resistance device being oppositely disposed from said fourth piezo-resistance device;

wherein said resistor for temperature compensation is connected in parallel with one of said third piezo-resistance device and said fourth piezo-resistance device; and wherein a resistor means for adjusting a gradient of the temperature characteristic curve of the output voltage signal of said resistance bridge circuit is interposed between said first piezo-resistance device and said fourth piezo-resistance device or between said second piezo-resistance device and said third piezo-resistance device;

wherein said resistor means includes a piezo-resistance device and a tap for adjusting the resistance value of said piezo-resistance device of said resistor means;

wherein said resistance bridge circuit is operable to issue an output voltage signal having a temperature characteristic curve which is coincident in shape with, and corresponds to a polarity inverted version of, a temperature characteristic curve of the output voltage signal issued from said temperature-compensating circuit; and wherein said adder circuit is operable to sum the output voltage signal issued from said resistance bridge circuit and the output voltage signal issued from said temperature-compensating circuit, and to issue a summed output voltage signal.

* * * * *